United States Patent [19]

Sato

[11] Patent Number: 4,888,737

[45] Date of Patent: Dec. 19, 1989

[54] SEMICONDUCTOR MEMORY DEVICE

[75] Inventor: Yoichi Sato, Iruma, Japan

[73] Assignees: Hitachi, Ltd.; Hitachi VLSI Engineering Corp., both of Tokyo, Japan

[21] Appl. No.: 148,432

[22] Filed: Jan. 26, 1988

[30] Foreign Application Priority Data

Jan. 26, 1987 [JP] Japan .................................. 62-14058

[51] Int. Cl.$^4$ .............................................. G11C 7/00
[52] U.S. Cl. ..................................... 365/203; 365/190
[58] Field of Search ............... 365/190, 203, 230, 189, 365/194, 227

[56] References Cited

U.S. PATENT DOCUMENTS 4,665,507  5/1987  Gondou et al. ...................... 365/190

Primary Examiner—Joseph A. Popek
Attorney, Agent, or Firm—Antonelli, Terry & Wands

[57] ABSTRACT

Plural pairs of complementary data lines coupled with plural memory cells are precharged to a positive source voltage level and a pair of common complementary data lines corresponding to the plural pairs of complementary data lines are precharged to ground potential. In synchronism with selection of a word line, a pair of the plural pairs of complementary data lines and the common complementary data lines are coupled through a switch circuit. A sense amplifier coupled with the common complementary data lines is supplied with a voltage composed of a voltage of approximately half the voltage value of the positive supply voltage and a readout voltage from the memory cell superposed thereon. Thus, after the precharging operation, there is no need for an equalizing operation before a word line is selected. Therefore, high-speed reading can be achieved.

19 Claims, 3 Drawing Sheets

SEMICONDUCTOR MEMORY DEVICE

BACKGROUND OF THE INVENTION

The present invention relates to a semiconductor integrated circuit device having a semiconductor memory device, and more particularly to a technology effective in application to a static RAM (random access memory) of a system in which data lines coupled with memory cells are precharged.

Memory cells in a MOS static RAM, for example, typically are constituted of static flip flop circuits, which are formed of a pair of drive MOSFETs with their gates and drains cross-connected, a load element, and a pair of transmission gate MOSFETs. The memory array includes, other than plural memory cells disposed as a matrix, plural pairs of complementary data lines, each pair thereof being coupled with input and output terminals of the corresponding memory cells.

A readout signal output from a selected memory cell is transmitted through a pair of the complementary data lines to be amplified by a sense amplifier circuit using, for example, a differential MOSFET arrangement.

Previously a multiplex apparatus has been developed in which plural digital channels are multiplexed in a single digital line and a static RAM is incorporated for performing high-speed transmission. In such a multiplex apparatus, the static RAM is used, for example, as a time-division switch. In such a case, the processing capacity of the multiplex apparatus is dependent on the access time of the incorporated static RAM. Therefore, as one of the methods to achieve the high speed functioning of such a static RAM thereby to improve the processing capacity of the multiplex apparatus, a half precharge method has been proposed in which the complementary data lines are charged to a voltage of approximately half the level of the source voltage Vcc.

Such a half precharge method is disclosed, for example, in U.S. patent applications Ser. No. 860411 by M. Uchida, Ser. No. 943063 by M. Uchida, and Ser. No. 60334 by A. Ito, of which the assignee is Hitachi, Ltd. the same as the assignee of the present application.

Referring to the aforesaid Ser. No. 860411, noninverted signal line D0 is precharged to the level of the source voltage Vcc and inverted signal line $\overline{D0}$ is precharged to ground potential GND of the circuit. Then, by shorting (equalizing) the noninverted signal line D0 and the inverted signal line $\overline{D0}$, both the signal lines are brought to a level of approximately ½ Vcc.

Referring to Ser. No. 943063, noninverted signal line D0 and inverted signal line $\overline{D0}$ are also brought to a level of approximately ½ Vcc by a similar precharge method to the above.

Referring to Ser. No. 60334, one set of complementary data lines D0, $\overline{D0}$ are precharged to a level of the source voltage Vcc and the other set of complementary data lines D1, $\overline{D1}$ are precharged to ground potential level of the circuit. Then, the former complementary data lines D0, $\overline{D0}$ and the latter complementary data lines D1, $\overline{D1}$ are shorted (equalized) and thereby both complementary data lines are brought to a level of approximately ½ Vcc. In this precharge method, a difference exists in the level between one and the other of the two sets of complementary data lines to be formed into one pair in the early stage. However, the noninverted signal lines and the inverted signal lines of the complementary data lines coupled with the input and output nodes of a memory cell are brought to the same level by the equalizing.

SUMMARY OF THE INVENTION

The present inventor found the following facts as the result of research conducted for obtaining a still faster static RAM in the aforementioned half precharge method capable of providing a short access time.

In the precharge methods disclosed in Ser. No. 860411 and Ser. No. 943063, two stages of precharging operations msut be performed, i.e., a first stage of precharging operation to bring the complementary data lines D0, $\overline{D0}$ to the level of the source voltage Vcc and the ground potential of the circuit, respectively, and a second stage of precharging operation for shorting the complementary data lines D0, $\overline{D0}$. At this time, if a word line is put into a selected state while a difference remains in the level between the complementary data lines D0, $\overline{D0}$, there is a risk of unwanted writing into the memory cell. Therefore, the selecting operation of the word line must be performed after the aforementioned first stage and second stage of precharging operations have been finished. Hence, the timing for selecting the word line is delayed and the operation is certainly slowed down accordingly.

In the precharge method disclosed in Ser. No. 60334, if a memory cell is selected before the complementary data lines, precharged to ground potential GND, have been brought to the level of approximately ½ Vcc after the shorting, information in the memory tends to be destroyed. Therefore, in this precharge method as well, it is required that a sufficient length of the equalizing time is provided as in the aforementioned precharge methods. Hence, the operation of the static RAM is slowed down.

DESCRIPTION OF THE PREFERRED EMBODIMENTS

Figure 1:
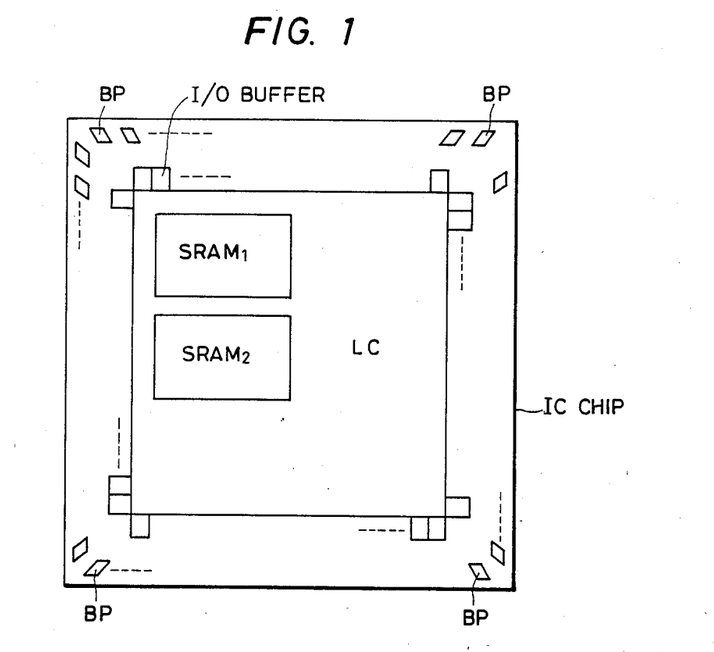
FIG. 1 is a plan view of an embodiment of a semiconductor substrate with static RAMs formed thereon to which the present invention is applied.

In FIG. 1 is shown a plan view of an embodiment of a semiconductor substrate (IC chip) having static RAMs, to which the present invention is applied, formed thereon. The static RAMs, in most cases, are incorporated in a one-chip digital processor such as a multiplex apparatus. Circuit blocks organizing such a multiplex apparatus are formed on a single semiconductor substrate as aforesaid which is, in most cases, made of a single crystalline silicon by the known fabrication techniques used for CMOS (complementary MOS) integrated circuits.

Referring to FIG. 1, there a plurality of bonding pads BP are formed in the peripheral area of the semiconductor substrate. Such bonding pads BP are coupled with the corresponding external terminals through bonding wires or the like. Some of these bonding pads BP are coupled with the corresponding unit circuits of input-/output circuits I/O disposed at the edge portions of the semiconductor substrate.

The input/output circuits I/O take in various input digital signals supplied from external devices and transmit them to the corresponding internal circuits of the multiplex apparatus, and also, deliver various output digital signals output from the corresponding internal circuits of the multiplex apparatus to external devices.

In a larger area on the semiconductor substrate, there is formed a logic circuit portion LC including arithmetic and logic units constituting the multiplex apparatus and various control units. The static RAMs (SRAMs) of the present embodiment are disposed in a predetermined region encircled by the aforesaid logic circuit portion LC. The static RAMs are generally used as time-division switches, so-called time switches.

In the present embodiment, there are provided two static RAMs, i.e., SRAM1 and SRAM2 although the present invention is not limited to this. While data is written into the static RAM SRAM1, the data written into the static RAM SRAM2 in the preceding period is read out. And, in the following period, while the data is read out from the static RAM SRAM1, new data is written into the static RAM SRAM2. In the described manner, the write operation of input data and read operation of output data are performed in parallel. The array of the input data is converted when the data is output. The conversion operation of the array is controlled by the logic circuit portion LC. As a result, the digital processor operates as a time switch.

Figure 2:
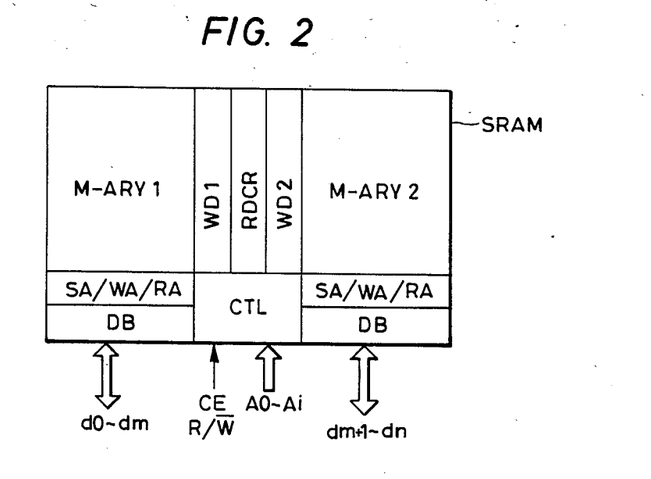
FIG. 2 is an arrangement drawing of the embodiment of the static RAM of FIG. 1.

In FIG. 2 is shown an arrangement drawing of an embodiment of the static RAMs of FIG. 1.

As shown in FIG. 2, the static RAM generally has two sets of memory arrays M-ARY1 and M-ARY2 as basic constituents thereof. Between the memory arrays M-ARY1 and M-ARY2, there is disposed a row address decoder RDCR. And between the row address decoder RDCR and the memory arrays M-ARY1, M-ARY2, there are disposed word line drive circuits WD1, WD2. Below each memory array, there are disposed a sense amplifier SA, write amplifier WA, and a read amplifier RA corresponding thereto. And, below each of the amplifiers, there are disposed corresponding data buffers DB. Below the row address decoder RDCR and the word line drive circuits WD1, WD2, there are disposed a control circuit CTL and an address input buffer which is not shown.

The memory arrays M-ARY1 and M-ARY2 are, as described later, constituted of word lines disposed in the horizontal direction in the drawing, complementary data lines disposed in the vertical direction, and memory cells disposed as a matrix at the intersections of the word lines and the complementary data lines. The row address decoder RDCR, coupled through the word line drive circuit with one of the word lines constituting each memory array, puts the word line into a selected state at the high level in an alternative way. On the other hand, the complementary data lines constituting each memory array are coupled with the corresponding write amplifier WA and read amplifier RA through the corresponding sense amplifier SA. The write amplifier WA and read amplifier RA are further coupled with the corresponding data buffers DB.

The static RAM is accessed through an internal bus provided in the multiplex apparatus. The internal bus includes (n+1)-bit data bus d0 - dn, (i+1)-bit address bus A0 - Ai, and a control bus including enable signal line CE, read/write signal line R/W, etc. In most cases, the static RAM is started by the enable signal CE and its operating mode is designated by the read/write signal R/W. These control signals are input to the control circuit CTL for the static RAM. The control circuit CTL, based on these control signals, generates various timing signals for controlling internal operations of the static RAM.

The address signals of i+1 bits supplied through the address bus A0 - Ai are input to an address input buffer, not shown, for the static RAM. These address signals are retained by the address input buffer and transmitted to the row address decoder RDCR as complementary signals. The row address decoder RDCR decodes these address signals and by actuating the word line driving circuits WD1, WD2 selects the designated word line.

Low-order bits d0 - dm of the data bus are put in correspondence with the complementary data lines of the memory array M-ARY1. And the high-order bits dm+1-dn are put in correspondence with the complementary data lines of the memory array M-ARY2. The data buses d0 - dn are coupled with the corresponding unit circuits of the data buffers DB, and the same in turn are connected with the complementary data lines of the corresponding memory array through the unit circuits of the read amplifier RA and write amplifier WA. Each of the unit circuits of the data buffers DB takes in the input data supplied through the corresponding data buses d0 - dn and transmit the data to the corresponding write amplifier WA, and also, transmits the output data delivered from the corresponding read amplifier RA to the corresponding data bus d0 - dn.

Figure 3:
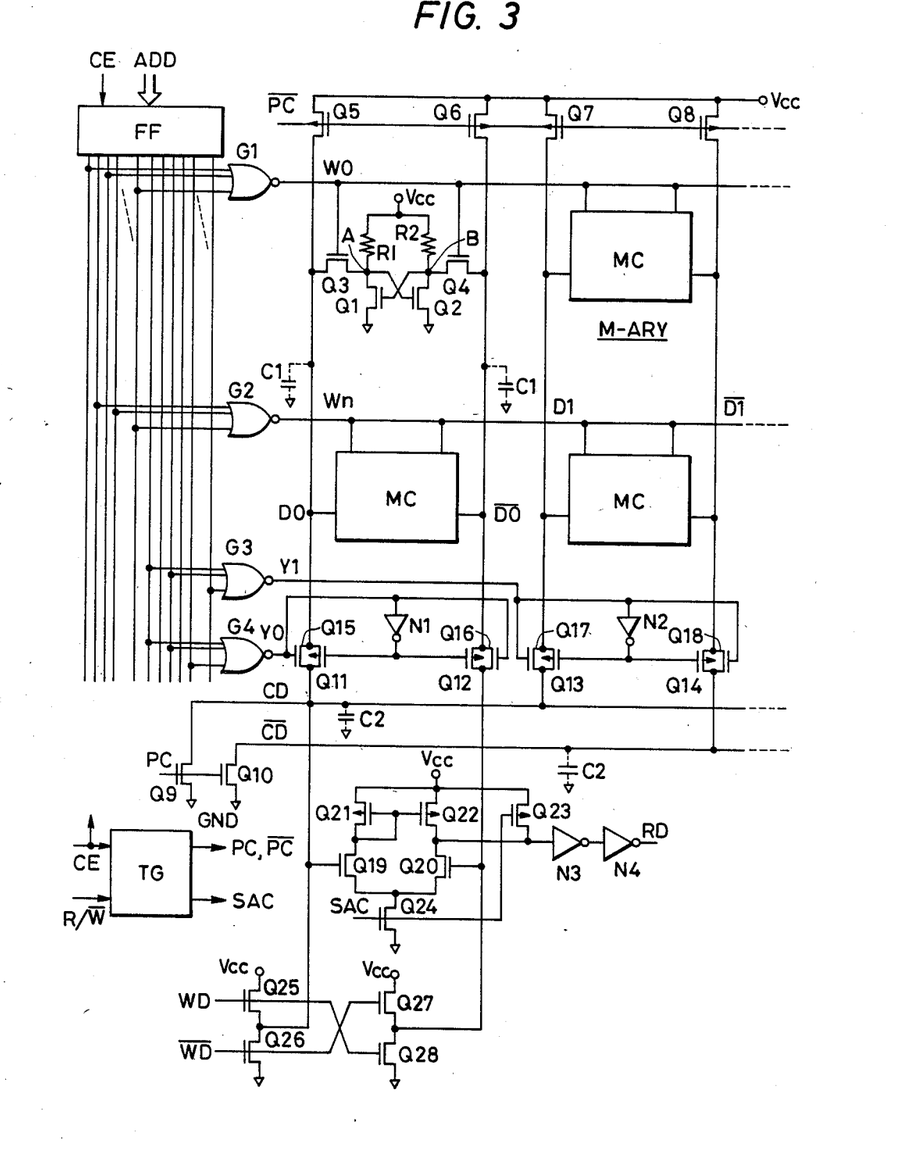
FIG. 3 is a circuit block diagram of an embodiment of a static RAM to which the present invention is applied.

In FIG. 3 is shown a circuit block diagram of an embodiment of the static RAM to which the present invention is applied. Referring to the figure, MOSFETs shown with an arrow at their channel (back gate) portion are of P channel type and distinguished from MOSFETs of N channel type which are shown without such an arrow.

The MOSFETs constituting the memory cells are provided as that of N-channel type and formed in a P-type well region formed on an N-type semiconductor substrate. P-channel MOSFETs are formed on the N-type semiconductor substrate. The P-type well region as the substrate gate of the N-channel type MOSFET is coupled with the grounded terminal of the circuit, whereas the N-type semiconductor substrate as the common substrate gate of the P-channel type MOSFETs is coupled with the power supply terminal of the circuit. Incidentally, the arrangement of the MOSFET constituting the memory cell formed in the well region is effective in preventing an erroneous reversal of stored information in the memory cell from being caused by α rays or the like. The MOSFET is produced by the so-called self-aligning technology in which the gate electrode formed of polysilicon acts as a kind of mask at the time of doping.

The memory array M-ARY is made up, as representatively illustrated in the figure, of a plurality of memory cells MC arranged in a matrix, word lines W0 to Wn, and complementary data lines D0, $\overline{D0}$ to D1, $\overline{D1}$ formed of a polysilicon layer. Data lines forming a complementary data line, for example, D0, $\overline{D0}$, constitute a pair of data lines.

Each of the memory cells MC are arranged to have the same structure as one another, and, as shown in the concrete circuit for a representative one thereof, includes memory MOSFETs Q1 and Q2 whose gates and drains are cross-coupled and sources are coupled with the grounded point of the circuit and high resistors R1 and R2 formed of a polysilicon (polycrystalline silicon) layer disposed between the drains of the aforesaid MOSFETs Q1, Q2 and the power supply terminal Vcc. Transmission gate MOSFETs Q3 and Q4 are also provided between the aforesaid common contact points of the MOSFETs Q1, Q2 and the complementary data lines D0, $\overline{D0}$. The gates of the transmission gate MOSFETs Q3, Q4 and others disposed on the same row of the memory cell are commonly connected to the corresponding word lines W0 and Wn, shown by way of example, and others. And, the input and output terminals of the memory cells disposed in the same columns are connected to the corresponding pairs of complementary data (or bit) lines, such as D0, $\overline{D0}$ and D1, $\overline{D1}$ shown by way of example.

In the memory cell, the MOSFETs Q1, Q2 and resistors R1, R2 constitute a kind of flip-flop circuit, but the operating point in its state of retaining information is considerably different from that of a flip-flop circuit in the ordinary sense. That is, in order to keep low the power consumption in the memory cell MC, the resistor R1 is made to have such a high resistance value that the gate voltage of the MOSFET Q2 when the MOSFET Q1 is held OFF is maintained at a voltage slightly higher than its threshold voltage. Likewise, the resistor R2 is provided with such a high resistance value. In other words, the aforesaid resistor R1, R2 is made highly resistive to such a degree that the drain leak current of the MOSFETs Q1, Q2 is just compensated. The resistors R1, R2 have current supplying capacity which is preferably just sufficient to prevent the information charges stored on the gate capacity (not shown) of the MOSFETs Q1, Q2 from being discharged.

According to the present embodiment as described above, though the RAM is produced by the CMOS-IC technology, the memory cell MC is structured of N-channel MOSFETs and polysilicon resistor elements.

The memory cell and memory array of the present embodiment can be made smaller in size as compared with the case where P-channel MOSFETs are used in place of the aforementioned polysilicon resistor elements. That is, when the polysilicon resistors are used, each one can be formed integral with the gate electrode of the drive MOSFET Q1 or Q2, and besides, its own size can be made smaller. Further, since there is no necessity for keeping a considerable distance from the drive MOSFETs Q1, Q2, as in the case where a P-channel MOSFET is used, no useless space is produced.

Referring to the same figure, the word line W0 is selected by an output signal produced in the NOR gate circuit G1 constituting an X address decoder. The same can be said of other word lines Wn. The aforesaid X address decoder is constituted of the NOR gate circuits G1, G2, etc. of similar structure to each other. Input terminals of these NOR gates G1, G2, etc. are, in most cases, supplied with a complementary address signal formed of plural bits indicating the pertinent X address of the address signal latched in the latch circuit FF, in a predetermined combination. The X address decoder decodes the aforesaid complementary address signal and puts a word line into a selected state.

The pair of complementary data lines D0, $\overline{D0}$ are connected, in most cases, through a CMOS switch consisting of P-channel MOSFETs Q11, Q12 and N-channel MOSFETs Q15, Q16 respectively connected in parallel, with common complementary data lines CD, $\overline{CD}$. The data lines CD, $\overline{CD}$ constituting the common complementary data line form a pair of common data lines. Also, the complementary data lines D1, $\overline{D1}$ which are shown by way of example are connected with the common complementary data lines CD, $\overline{CD}$ through a CMOS switch similarly consisting of P-channel MOSFETs Q13, Q14 and N-channel MOSFETs Q17, Q18. The same can be said of other complementary data lines which are not shown, i.e., they are connected with the common complementary data lines CD, $\overline{CD}$ through similar CMOS switches.

Of the aforementioned CMOS switches, the gates of the N-channel MOSFETs Q15, Q16 and Q17, Q18 are coupled with column select lines Y0, Y1, respectively. The gates of the P-channel MOSFETs Q11, Q12 and Q13, Q14 are supplied with output signals of inverter circuits N1, N2 receiving signals from the aforesaid column select lines Y0, Y1.

The above described organization using the CMOS switches as column switches enables high-speed read and write operations. For example, in the read operation, when the complementary data lines D0, $\overline{D0}$ are put into a selected state by the column select line Y0 brought to the high level, the P-channel MOSFETs Q11, Q12 act as amplifying MOSFETs, with gates grounded and sources receiving inputs, and are thereby enabled to have the signals, which are read out from the memory cell and delivered to the complementary data lines D0, $\overline{D0}$, transmitted effectively to the common complementary data lines CD, $\overline{CD}$. And, in the write operation, the N-channel MOSFETs Q15, Q16 act as amplifying MOSFETs, with gates grounded and sources receiving inputs, and are thereby enabled to have the write signals delivered to the common complementary data lines CD, $\overline{CD}$ transmitted effectively to the complementary data lines D0, $\overline{D0}$ with which the selected memory cell is coupled. The same can be said of the operations when other complementary data lines D1, $\overline{D1}$, etc. are selected.

The aforesaid column select line Y0 is selected by the output signal generated by the NOR gate circuit G4 constituting a Y address decoder. This can be said of other column select lines Y1. The Y address decoder is constituted of NOR gate circuits G4, G3, etc. similar to each other. Input terminals of these NOR gates G4, G3, etc. are, in most cases, supplied with a complementary address signal formed of plural bits indicating the pertinent Y address of the address signals latched in the latch circuit FF, in a predetermined combination. The Y address decoder decodes the aforesaid complementary address signal and puts a column select line into a selected state. For example, when a column select line Y0 is brought to the high level, the N-channel MOSFETs Q15 and Q16 are brought to the ON state and also the P-channel MOSFETs Q11 and Q12 are brought to the ON state by the output signal of the inverter circuit N1 going to the low level, whereby the complementary data lines D0, $\overline{D0}$ are coupled with the common complementary data lines CD, $\overline{CD}$.

The aforementioned latch circuit FF takes in the address signal ADD, in most cases, at the timing of the chip enable signal CE going from low level to high level. Although not shown, the X address decoder and the Y address decoder start their select operations when the aforesaid signal CE is brought to the high level.

The complementary data lines D0, $\overline{D0}$ and D1, $\overline{D1}$ are provided, in most cases, with P-channel precharge MOSFETs Q5 to Q8. The gates of the aforesaid MOS- FETs Q5 to Q8 are commonly supplied with a precharge signal PC. The precharge MOSFETs Q5 to Q8 are held in the ON state during a precharge period when the precharge signal PC is held at the low level, whereby the complementary data lines D0, $\overline{D0}$ and D1, $\overline{D1}$ are charged up to a first voltage source level as high, for example, as the source voltage Vcc.

The arrangement using the P-channel MOSFETs as the precharge MOSFETs has such an effect that, even if a sudden drop in the source voltage (power bump) occurs, the level of the complementary data lines D0, $\overline{D0}$ and D1, $\overline{D1}$ is enabled to follow the aforesaid variation of the source voltage. It is effective in that deterioration in operating margin is prevented from being caused by such a condition of the potential of the complementary data lines being kept higher than the source voltage when the source voltage is lowered.

The common complementary data lines CD, $\overline{CD}$ are, in most cases, provided with N-channel type precharge MOSFETs Q9 and Q10. The gates of the MOSFETs Q9 and Q10 are commonly supplied with a precharge signal $\overline{PC}$. The precharge MOSFETs Q9 and Q10 are kept at the ON state during a precharge period when the precharge signal $\overline{PC}$ is kept at the high level, whereby the common complementary data lines CD, $\overline{CD}$ are brought to a second source voltage level as low, for example, as the ground potential GND of the circuit.

The aforesaid common complementary data lines CD, $\overline{CD}$ are, in most cases, coupled directly with the input terminal of a differential type sense amplifier. That is, the complementary data lines CD, $\overline{CD}$ are respectively coupled with the gates of N-channel type differential amplifying MOSFETs Q19, Q20. The drains of the differential MOSFETs Q19, Q20 are provided with an active load circuit constituted of P-channel MOSFETs Q21, Q22 arranged in a current Miller configuration. The differential MOSFETs Q19, Q20 are turned into an operating state by an N-channel type power switch MOSFET Q24 disposed between their common source and the ground potential point of the circuit and put into the ON state by a timing signal SAC. The amplified output signal of the sense amplifier is output through CMOS inverter circuits N3, N4 constituting the read circuit.

Between the output terminal of the aforesaid sense amplifier, or the input terminal of the inverter circuit N3, and the source voltage Vcc, there is disposed a P-channel MOSFET Q23 receiving the aforesaid timing signal SAC. The MOSFET Q23, when the sense amplifier is put into a nonoperating state by the timing signal SAC turning to the low level, is put into the ON state and pulls its output voltage up to the level of the supply voltage Vcc. This prevents occurrence of a relatively large amount of through current (D.C. current) in the inverter circuit N3, which receives the voltage at the aforesaid output terminal, due to the input voltage thereto being brought into an intermediate level in a floating state. Therefore, the MOSFET Q23 can be replaced by a pull-up (to Vcc level) or pull-down (to ground potential of the circuit) high resistance element.

Further, the aforesaid complementary data lines CD, $\overline{CD}$ are connected to the output terminals of the following write circuits.

The write circuit is constituted of N-channel MOSFETs Q25, Q26 and Q27, Q28 arranged in a push-pull configuration. The aforesaid output MOSFETs Q25, Q28 and Q26, Q27 are respectively supplied with complementary write signals WD, $\overline{WD}$ in a crossing manner and thereby generate complementary write signals and transmit the same to the common complementary data lines CD, $\overline{CD}$. Thus, the write signals are supplied to the selected memory cell through the aforesaid complementary data lines CD, $\overline{CD}$, column switch, and complementary data lines and a write operation is thereby performed therein. Here, the complementary write signals WD, $\overline{WD}$ are both placed at the low level except when the write operation is performed and the MOSFETs Q25, Q26 as well as Q27, Q28 are both put into the OFF state. And thereby, the output of the write circuit is turned into a high impedance state.

Timing generator circuit TG generates the above mentioned precharge signals PC, $\overline{PC}$, operating timing signal SAC for the sense amplifier, etc. responding to the chip enable signal CE and read/write signal R/W.

Figure 4:
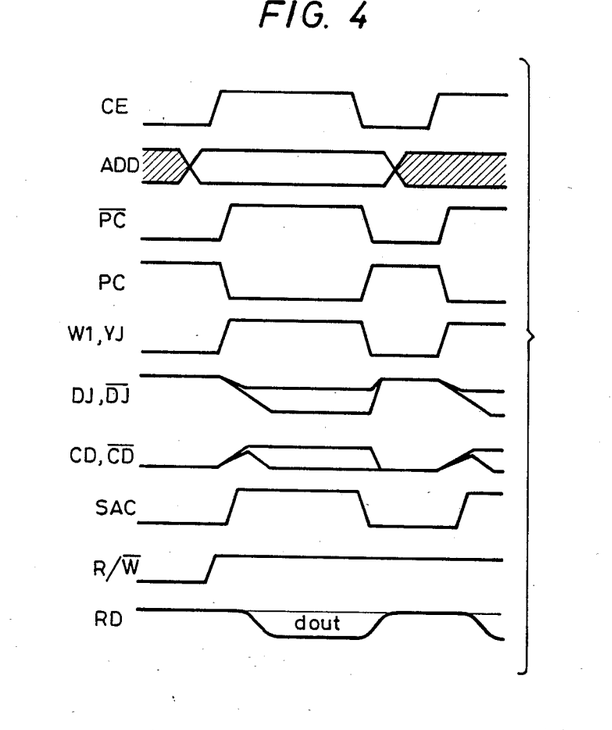
FIG. 4 is a timing chart showing an example of read operation in the RAM of the present embodiment.

An example of the read operation in the RAM of the present embodiment will be described below with reference to the schematic timing chart as shown in FIG. 4.

When the chip enable signal CE is at the low level, the timing generator circuit TG places the precharge signal PC at the low level and the precharge signal $\overline{PC}$ at the high level. By the aforesaid precharge signal PC placed at the low level, the P-channel MOSFETs Q5 to Q8, etc. are turned to the ON state, and thereby, the complementary data lines D0, $\overline{D0}$; D1, $\overline{D1}$; etc. are precharged to the level as high as the source voltage Vcc. And, by the precharge signal $\overline{PC}$ placed at the high level, the N-channel MOSFETs Q9 and Q10 are put into the ON state, and thereby the complementary data lines CD, $\overline{CD}$ are precharged to the level as low as the ground potential GND of the circuit.

At the timing when the chip enable signal CE is changed from the low level to the high level, the latch circuit FF takes in the address signal ADD supplied thereto. Thereupon, the X address decoder and Y address decoder decode the address signal ADD retained by the latch circuit FF and put one word line Wi and one column select line Yj corresponding to a pair of complementary data lines Dj, $\overline{Dj}$ into select states at the high level. At the same time, responding to the chip enable signal CE changing to the high level, the precharge signal PC is changed from the low level to the high level and the precharge signal $\overline{PC}$ is turned from the high level to the low level, and thereby the precharge MOSFETs Q5–Q8 and Q9, Q10 are put into the OFF state.

With the select operation of the column select line Yj, the common complementary data lines CD, $\overline{CD}$ and a pair of the complementary data lines Dj, $\overline{Dj}$, respectively, are coupled together. By virtue of this coupling, the potential levels of the complementary data lines Dj, $\overline{Dj}$ and the common complementary data lines CD, $\overline{CD}$ tend to go to the itnermediate equal levels (i.e., intermediate between the high level of Vcc and ground level) dependent upon the ratio of the stray capacitance attached to each thereof parasitically. Since the select operation of the word line Wi is also done at the same time, there appear readout signals on the complementary data lines Dj, $\overline{Dj}$ in accordance with stored information in the selected memory cell. Therefore, the potential levels of the complementary data lines Dj, $\overline{Dj}$ and the common complementary data lines CD, $\overline{CD}$ become such voltages that the signal voltages read out from the memory cell are superposed upon the aforesaid voltages changed to the intermediate potential levels. The readout signals from the memory cell are transmitted to the side of the complementary data lines CD, CD through the amplification by the P-channel MOSFETs constituting the column switch as described above.

The timing generator circuit TG when instructed to make a read operation by the read/write control signal R/W, changes the timing signal SAC from the low level to the high level. Thereupon, the power switch MOSFET Q24 of the sense amplifier is put into the ON state whereby the differential operating MOSFETs Q19, Q20 are supplied with operating currents. When the sense amplifier is thus put into the operating state, the same is biased to its most sensitive operating point because the input voltage thereto is raised to the intermediate potential by the above described coupling of the complementary data lines Dj, Dj with the common complementary data lines CD, CD, so that the same is enabled to perform an amplifying operation of the minute readout signal superposed on the intermediate potential. And thus, a high-speed readout operation is made possible. That is, according to the present embodiment, since the sense amplifier is caused to perform the amplifying operation at its most sensitive operating point, the select operation of the column switch is utilized without the need for specially providing a second stage precharge period (equalize period). Therefore, the setting of the time required for the precharging can be eliminated and the high speed operation is ensured accordingly.

Further, since the complementary data lines D0, D0; D1, D1; etc. are precharged to the side of the source voltage Vcc, there is no risk of erroneous reversal of information in the memory cell even if the select operation of the word line and the memory access are executed at the same time.

In contrast with the above, in the arrangement of precharging all of the complementary data lines D0, $\overline{D0}$; D1, $\overline{D1}$; etc. to the side of the ground potential of the circuit, erroneous writing is liable to occur. The reason for this is that, when a word line is selected when the complementary data lines are at the low level, the potential of the high level side of the flip-flop constituting the memory cell changes to the potential at the low level rather easily. For example, in the memory cell as shown in FIG. 3, we suppose that potential at the high level is retained at the node A and potential at the low level is retained at the node B. Then, if the word line W0 is brought to the high level with both of the complementary data lines D0, $\overline{D0}$ held at the potential of the low level, a current flows between the supply terminal of source voltage Vcc and the data line D0 through the load resistor R1 and the MOSFET Q3. As a result, an unwanted change of the potential at the node A from the high level to low level occurs due to a voltage drop produced in the load resistor R1.

In such a case, if the complementary data lines D0, $\overline{D0}$ are both held at the high level as in the present embodiment, the potential at the node A is retained at the high level even when the word line W0 is brought to the high level. The potential at the low level at the node B also remains as it is. Since the charges precharged on the data line $\overline{D0}$ coupled with the node B are discharged through the MOSFET Q2 then on the ON state, no unwanted change of the potential at node B from the low level to high level occurs.

Thus, the operations for word line selection and others can be started immediately after the operation for precharging the complementary data lines has been finished.

Figure 5:
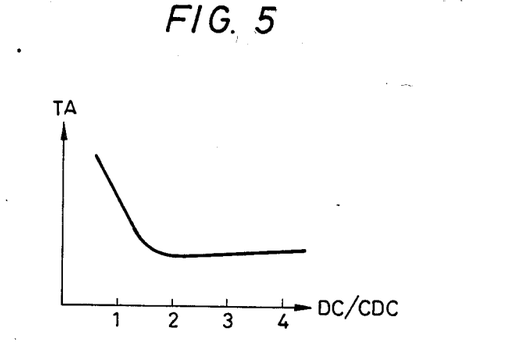
FIG. 5 is a characteristic curve showing the relationship between reading access time and the ratio of capacitance between a data line and a common data line.

In FIG. 5 is shown the relationship between access time TA and ratio of capacitance DC/CDC, i.e., the ratio of the capacitance value DC of the capacity C1 of each of the complementary data lines in the above memory array M-ARY to the capacitance CDC of the capacity C2 of each of the common complementary data lines. The characteristic is obtained by computer simulation and it is shown that the shortest access time TA is obtained when the capacitance CDC of the common complementary data lines is set to half of the capacitance DC of the complementary data lines. The reason is that, by adapting the capacitance of the common complementary data lines CD, CD to be lower than the capacitance DC of the complementary data lines, the potential on the common complementary data lines CD, CD can be quickly changed to the most sensitive operating point of the sense amplifier with the aforesaid select operation of the column switch. Therefore, it is desired that the above capacitance ratio is obtained by setting the number of the complementary data lines to be coupled with a pair of common complementary data lines CD, CD (which can be used to change the length of the common complementary data line to adjust its relative capacitance), or by adding dummy capacity to the common complementary data lines when the parasitic capacity thereof is small. When, conversely, the capacitance of the common complementary data lines is large, it is preferred to divide the common complementary data lines into divisions and provide each division with a sense amplifier, or to increase the number of memory cells to be coupled with the complementary data lines. By the adjustment of the number of word lines and data lines organizing the memory array M-ARY or the like in the described manner, the most effective reading operation can be provided.

A write operation is performed by writing into the memory cell using a signal at a high level, and therefore, writing can be performed in a shorter time compared with the reading. Hence, the access time of the RAM is determined by the read operation, and high-speed operation of the RAM is achieved by employing the aforementioned precharge and memory access method.

Further, in the embodiment of FIG. 3, it is possible to achieve a higher-speed read operation of the information stored in the memory cell by adapting the values of the parasitic capacitance attached to each of the common complementary data lines CD, CD to be different from each other. In the present embodiment, it is advantageous to make the capacitance of the parasitic capacity attached to each of the complementary data lines CD smaller than the capacitance of the parasitic capacity attached to each of the complementary data lines CD. By setting the relative magnitude of the capacitance between the two lines as aforesaid, the relative magnitude of the rising speeds to the high level of the potential of each of the data lines CD, CD can be controlled accordingly. That is, the potentials of both the common complementary data lines CD, CD go from low level to high level upon turning to the ON state of the column switch (for example, MOSFETs Q11, Q12, Q15, and Q16), with the rising speed on the side of the complementary data line CD being higher than that on the side of the complementary data line CD.

Therefore, when information at the high level is stored at the aforesaid node B of the memory cell and information at the low level is stored at the aforesaid node A, the direction of the minute potential difference produced between the complementary data lines D0, $\overline{D0}$ according to the aforesaid memory cell information agrees with the direction of the potential difference produced between the common complementary data lines CD, CD based on the difference in the values of capacitance. As a result, the minute potential difference produced between the aforesaid complementary data lines D0, $\overline{D0}$ is enlarged more quickly. Hence, the amplifying operation of the sense amplifier consisting of the MOSFETs Q19–Q24 is performed more speedily. At this time, the output signal produced at the junction point between the MOSFETs Q22 and Q20 speedily changes from the high level to the low level.

In contrast with the above, when information at the low level is stored at the node B and information at the high level is stored at the node A, the direction of the minute potential difference produced between the complementary data lines D0, $\overline{D0}$ according to the aforesaid memory cell information does not agree with the direction of the potential difference produced between the common complementary data lines CD, CD based on the difference in the values of capacitance. However, the high-speed reading function is not thereby impaired. The reason is that, in this case, the output signal of the sense amplifier provided at the junction point of the MOSFETs Q22 and Q20 remains at the high level at the time of the precharging.

Therefore, in the case where the sense amplifier of the present embodiment is used, the high-speed reading operation can be achieved only by adapting the operation of the output of the sense amplifier to be performed at a high-speed when it changes from the high level to the low level.

Incidentally, if the capacitance of the parasitic capacity attached to the complementary data line CD is made extremely smaller than the capacitance of the parasitic capacity attached to the complementary data line CD, a reversal of the memory cell information itself is produced. This can lead to an erroneous operation to read wrong information. According to an investigation made by the inventor, the above mentioned ratio of capacitance values is preferred to be 6:5 or thereabouts.

The functions performed by and effects obtained from the above described embodiment are as follows:

(1) During the precharging period, the pairs of the data lines coupled with the memory cells are precharged to the level of the source voltage and the pair of the common data lines to be coupled with the aforesaid data lines through a column switch are precharged to the ground potential of the circuit. Then, with the operation to select a memory cell, a pair of the data lines and the pair of the common data lines are coupled through the column switch, whereby the potential of the pair of the data lines and the pair of the common data lines can be set to an intermediate potential level with only a single precharging step. Therefore, upon the selection of the memory cell, the sense amplifier is enabled to perform its amplifying operation of a readout signal at its most sensitive operating point, and thereby, such an effect is obtained that high-speed reading operation with reduced time for precharging can be achieved.

(2) Since the potential of the pair of the data lines and the pair of the common data lines can be set to the intermediate potential level by utilization of the column switch, the effect of simplification of the circuit is obtained.

(3) By virtue of the arrangement such that, during the precharging period, the pairs of the data lines coupled with the memory cells are precharged to the level of the source voltage and a pair of the common data lines to be coupled with a pair of the data lines through a column switch are precharged to the ground potential of the circuit, the need for providing special time margins for the selecting operation of the memory cell and for the operating timing of the sense amplifier can be eliminated, and therefore, setting of the timing can be simplified and large operating margins can be provided.

Although the invention made by the present inventor has been described in its preferred embodiment with a certain degree of particularity, it is to be understood that the present invention is not limited to the above described embodiment and that various changes may be made without departing from the spirit of the invention. For example, the memory cell described as a static RAM may be of a complete static type constituted of a combination of a P-channel MOSFET and an N-channel MOSFET. And, when the common complementary data line is divided and each division is provided with a sense amplifier, the output side thereof may be provided with a second column select circuit, or the sense amplifier itself may be adapted to be selectively put into its operating state by a second column select signal. The method of memory access may be of an internal synchronization system in which a change in the address signal is detected and thereupon the precharge signal is generated.

In the above description, although the invention made by the present inventor has been chiefly described in its example applied to the RAMs incorporated in the digital integrated circuit which is in the technical field constituting the background of the invention, it is not limited to the same. The present invention is similarly applicable, for example, to a RAM to be incorporated in a one chip microcomputer, or to a semiconductor memory device or the like as an external memory unit. Other than the application to such RAMs as aforementioned, it can be equally applied to various ROMs (read only memories) such as mask ROMs and EPROMs (erasable and programmable ROMs). Since the memory cell is coupled with one data line in such ROMs, when a differential type sense amplifier is used, it is adapted such that a reference voltage is provided and the readout signal therewith is sensed. In such a case, the reference voltage is provided by the use of a constant-voltage circuit or dummy cell. Also in such ROMs, it is possible to have the data line precharged to the level of the source voltage and the common data line precharged to the ground potential of the circuit, and thereby, to set the D.C. potential of the common data line to the most sensitive operating point of the sense amplifier responding to the operation to select a memory cell, and therefore a high-speed read operation can be achieved.

What is claimed is:

1. A semiconductor memory device comprising:
   a plurality of word lines, a pair of first data lines, and a pair of second data lines provided corresponding to said pair of first data lines;
   a plurality of memory cells coupled with each of said word lines and with said pair of first data lines;
   switch means for electrically separating or coupling said pair of first data lines and said pair of second data lines;
   first precharge means for setting the voltage of said pair of first data lines to a first voltage level other than a ground voltage level;

second precharge means for setting the voltage on said pair of second data lines to a ground voltage level; and a sense amplifier coupled with said pair of second data lines, wherein information in a selected memory cell is transmitted to said sense amplifier through said pair of first data lines, said switch means, and said pair of second data lines.

2. In a semiconductor memory device according to claim 1, wherein said first voltage level is a positive source voltage level.

3. In a semiconductor memory device according to claim 2, wherein said switch means couples said pair of first data lines with said pair of second data lines in synchronism with the timing at which the voltage of the word line corresponding to the memory cell to be selected changes to a select level.

4. In a semiconductor memory device according to claim 3, wherein said switch means is actuated under control of a decoder decoding an address signal.

5. A semiconductor memory device comprising:
a plurality of word lines;
a pair of first data lines;
a pair of second data lines;
a pair of third data lines provided coupled to said pair of first data lines and said pair of second data lines;
a first group of memory cells coupled with each of said word lines and with said pair of first data lines;
a second group of memory cells coupled with each of said word lines and with said pair of second data lines;
first switch means for electrically separating or coupling said pair of first data lines and said pair of third data lines;
second switch means for electrically separating or coupling said pair of second data lines and said pair of third data lines;
first precharge means for setting the voltage of said pair of first data lines and the voltage of said pair of second data lines to a first voltage level other than a ground voltage level;
second precharge means for setting the voltage of said third pair of data lines to a ground voltage level; and
a sense amplifier coupled with said pair of third data lines; wherein information in a memory cell selected from said first group of memory cells is transmitted to said sense amplifier through said pair of first data lines, said first switch means, and said pair of third data lines, and wherein information in a memory cell selected from said second group of memory cells is transmitted to said sense amplifier through said pair of second data lines, said second switch means, and said pair of third data lines.

6. In a semiconductor memory device according to claim 5, wherein said first voltage level is a positive source voltage level.

7. In a semiconductor memory device according to claim 6, wherein a predetermined one of said first switch means or second switch means couples said pair of first data lines with said pair of third data lines or said pair of second data lines with said pair of third data lines in synchronism with the timing at which the voltage of the word line corresponding to the memory cell to be selected changes to a select level.

8. In a semiconductor memory device according to claim 7, wherein said first switch means and second switch means are actuated under control of a decoder decoding an address signal.

9. A semiconductor memory device according to claim 1, wherein said pair of first data lines has a predetermined capacitance, wherein said pair of second data lines has a predetermined capacitance and wherein the capacitance of said pair of second data lines is less than the capacitance of said pair of first data lines.

10. A semiconductor memory device according to claim 9, wherein each data line of said pair of second data lines has an individual capacitance value, and wherein this value is set so that the capacitance value of one of said data lines of said pair of second data lines is higher than the capacitance value of the other.

11. A semiconductor memory device according to claim 1, wherein a plurality of pairs of first data lines are provided to be coupled to a single pair of said second data lines so that said pair of second data lines comprises a pair of common complementary data lines.

12. A semiconductor memory device according to claim 1, wherein the switching means couples the pair of first data lines with the pair of second data lines at a predetermined time to establish a voltage level on both the pairs of first and second data lines between the first voltage level and the ground voltage level.

13. A semiconductor memory device according to claim 12, wherein said switch means couples said pair of first data lines with said pair of second data lines in synchronism with the timing at which the voltage of the word line corresponding to the memory cell to be selected changes to a select level.

14. A semiconductor memory device according to claim 5, wherein a predetermined one of said first switch means or said second switch means couples said pair of first data lines or said pair of second data lines with said pair of third data lines at a predetermined time to establish a level on both the pairs of first and third data lines or the pair of second and third data lines, respectively; between said first and ground voltage levels.

15. A semiconductor memory device according to claim 14, wherein a predetermined one of said first switch means or second switch means couples said pair of first data lines with said pair of third data lines or said pair of second data lines with said pair of third data lines in synchronism with the timing at which the voltage of the word line corresponding to the memory cell to be selected changes to a select level.

16. A semiconductor memory device comprising:
a plurality of word lines, a pair of first data lines, and a pair of second data lines provided corresponding to said pair of first data lines;
a plurality of memory cells coupled with each of said word lines and with said pair of first data lines;
switch means for electrically separating or coupling said pair of first data lines and said pair of second data lines;
first precharge means for setting the voltage of said pair of first data lines to a first voltage level;
second precharge means for setting the voltage of said pair of second data lines to a second voltage level different than said first voltage level; and
a sense amplifier coupled with said pair of second data lines, wherein information in a selected memory cell is transmitted to said sense amplifier through said pair of first data lines, said switch means, and said pair of second data lines, wherein said first precharge means includes a first switching means for connecting said pair of first data lines and a first voltage source providing said first voltage level, wherein said second precharge means includes a second switching means for connecting said pair of second data lines and a second voltage source providing said second voltage level, and wherein said first and second switching means are activated in a predetermined period before said pair of first data lines and said pair of second data lines are coupled to one another and are unactivated while information in a selected memory cell is being transmitted to said sense amplifier.

17. A semiconductor memory device according to claim 1, wherein said first and second precharge means are comprised of MOS transistors.

18. A semiconductor memory device according to claim 5, wherein said first and second precharge means are comprised of MOS transistors.

19. A semiconductor memory device according to claim 16, wherein said first and second precharge means are comprised of MOS transistors.

* * * * *